(12) United States Patent
Sherlock et al.

(10) Patent No.: US 10,649,829 B2
(45) Date of Patent: May 12, 2020

(54) TRACKING ERRORS ASSOCIATED WITH MEMORY ACCESS OPERATIONS

(71) Applicant: HEWLETT PACKARD ENTERPRISE DEVELOPMENT LP, Houston, TX (US)

(72) Inventors: Derek Alan Sherlock, Boulder, CO (US); Shawn Walker, Ft. Collins, CO (US); Paolo Faraboschi, Sant Cugat (ES)

(73) Assignee: Hewlett Packard Enterprise Development LP, Houston, TX (US)

( * ) Notice: Subject to any disclaimer, the term of this patent is extended or adjusted under 35 U.S.C. 154(b) by 111 days.

(21) Appl. No.: 15/645,105

(22) Filed: Jul. 10, 2017

(65) Prior Publication Data

US 2019/0012222 A1 Jan. 10, 2019

(51) Int. Cl.
*G06F 11/00* (2006.01)
*G06F 11/07* (2006.01)
(Continued)

(52) U.S. Cl.
CPC ........ *G06F 11/073* (2013.01); *G06F 11/0754* (2013.01); *G06F 11/0772* (2013.01);
(Continued)

(58) Field of Classification Search
CPC ............... G06F 11/073; G06F 11/0754; G06F 11/0772; G06F 11/0766; G06F 11/0778; G06F 11/0781; G06F 11/0793; G06F 11/1402; G06F 11/1407; G06F 11/141; G06F 11/16; G06F 11/1608; G06F 11/1629; G06F 11/165; G06F 11/1666; G06F 11/2017; G06F 11/202; G06F 11/30; G06F 11/3034; G06F 11/3037; G06F 11/3072; G06F 11/3079; G06F 11/3082; G06F 11/34; G06F 11/36; G06F 13/1668; G06F 2213/16; G11C 29/028; G11C 29/50016;
(Continued)

(56) References Cited

U.S. PATENT DOCUMENTS 5,065,354 A 11/1991 Jons
7,756,053 B2 * 7/2010 Thomas ................ G06F 11/073
370/216
(Continued)

OTHER PUBLICATIONS

Brown, A.; Towards Availability and Maintainability Benchmarks: a Case Study of Software RAID Systems; http://roc.cs.berkeley.edu/papers/masters.pdf; Jan. 2001; 107 pages.
(Continued)

*Primary Examiner* — Anthony J Amoroso
(74) *Attorney, Agent, or Firm* — Park, Vaughan, Fleming & Dowler LLP

(57) ABSTRACT

In some examples, a controller includes a counter to track errors associated with a group of memory access operations, and processing logic to detect an error associated with the group of memory access operations, determine whether the detected error causes an error state change of the group of memory access operations, and cause advancing of the counter responsive to determining that the detected error causes the error state change of the group of memory access operations.

20 Claims, 6 Drawing Sheets

(51) Int. Cl.
*G11C 29/02* (2006.01)
*G11C 29/50* (2006.01)
*G11C 29/56* (2006.01)
*G11C 29/52* (2006.01)

(52) U.S. Cl.
CPC ...... *G11C 29/028* (2013.01); *G11C 29/50016* (2013.01); *G11C 29/52* (2013.01); *G11C 29/56012* (2013.01)

(58) Field of Classification Search
CPC ... G11C 29/56012; G11C 29/02; G11C 29/52; G11C 29/56008; G11C 2029/5606
See application file for complete search history.

(56) References Cited

U.S. PATENT DOCUMENTS

| | | | |
|---|---|---|---|
| 7,877,748 B2 | 1/2011 | Kwiat et al. | |
| 8,290,899 B2 | 10/2012 | Webman et al. | |
| 8,468,385 B1* | 6/2013 | Balachandriah | G06F 11/0727 714/3 |
| 8,595,595 B1 | 11/2013 | Grcanac | |
| 9,075,952 B2 | 7/2015 | Niell et al. | |
| 9,244,839 B2* | 1/2016 | Sakthivelu | G06F 12/0804 |
| 9,262,225 B2* | 2/2016 | Davis | H04L 45/60 |
| 2001/0056521 A1* | 12/2001 | Fujiwara | G06F 11/3037 711/167 |
| 2008/0130440 A1 | 6/2008 | Liao | |
| 2008/0301529 A1* | 12/2008 | Spanel | G06F 11/1012 714/765 |
| 2008/0301530 A1* | 12/2008 | Spanel | G06F 11/1012 714/765 |
| 2010/0077262 A1* | 3/2010 | Morosawa | G06F 11/165 714/48 |
| 2010/0205391 A1* | 8/2010 | Miyamoto | G06F 11/008 711/162 |
| 2010/0332901 A1* | 12/2010 | Nussbaum | G06F 9/3004 714/16 |
| 2012/0221884 A1* | 8/2012 | Carter | G06F 11/0772 714/2 |
| 2015/0199268 A1 | 7/2015 | Davis | |

OTHER PUBLICATIONS

Dr. David J Greaves, "System on Chip Design and Modelling," Lecture Notes, University of Cambridge, UK, Available at: <cl.cam.ac.uk/teaching//1516/SysOnChip/materials.d/socdam-notes00.pdf> 2015 (144 pages).

Sherlock et al., U.S. Appl. No. 15/453,212 entitled Issuing Write Requests to a Fabric, filed Mar. 8, 2017 (41 pages).

* cited by examiner

TRACKING ERRORS ASSOCIATED WITH MEMORY ACCESS OPERATIONS

BACKGROUND

A computing system can include a processor and a memory (or multiple processors and/or multiple memories), in addition to other devices. A processor can issue access requests to a memory. The memory can be implemented using a non-persistent (or volatile) memory device and/or a persistent (or non-volatile) memory device. Examples of non-persistent memory devices include dynamic random access memories (DRAMs), static random access memories (SRAMs), and so forth. Examples of persistent memory devices include flash memory devices, memristor memory devices, phase change memory devices, electrically erasable and programmable read-only memory (EEPROM) devices, and so forth.

BRIEF DESCRIPTION OF THE DRAWINGS

Some implementations of the present disclosure are described with respect to the following figures.

Figure 1:
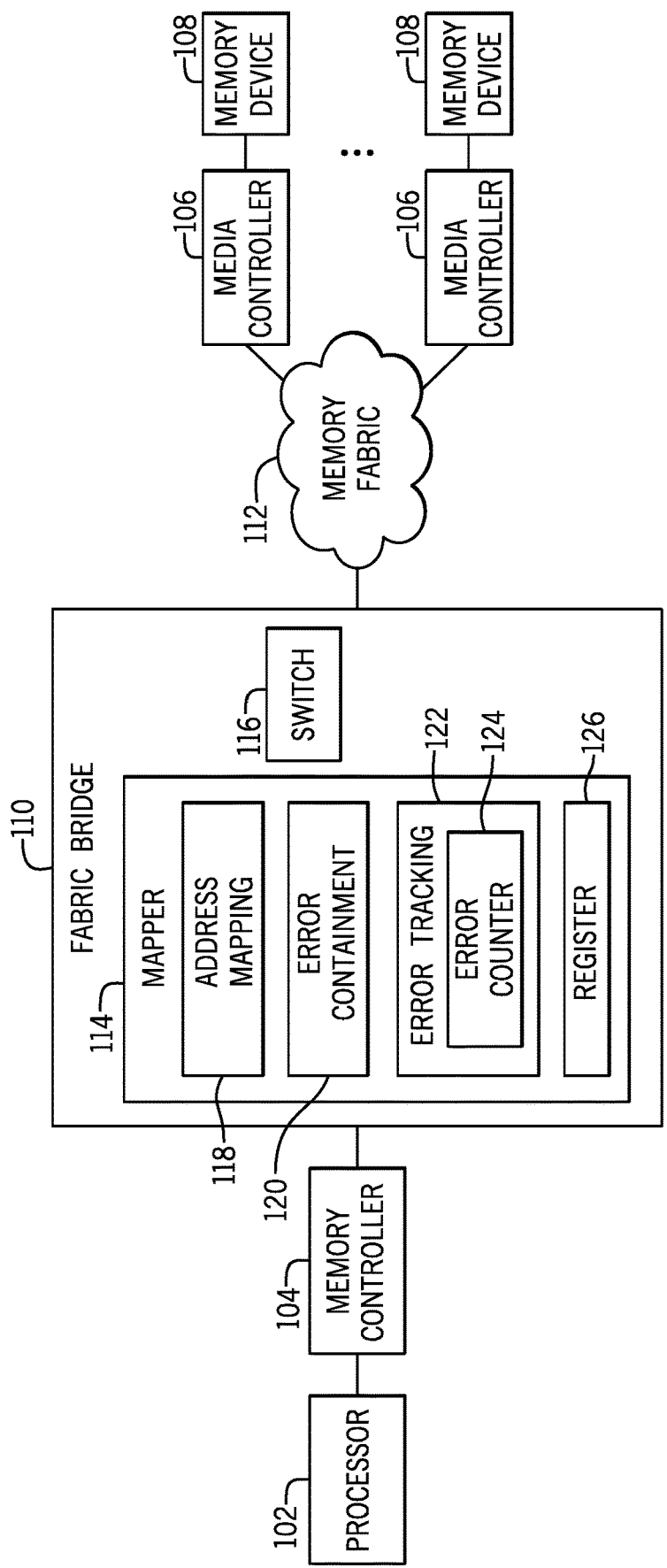
FIG. 1 is a block diagram of a system according to some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

Nodes of a computing system can include processors, memory devices (including persistent memory devices and non-persistent memory devices), input/output (I/O) devices, and other devices. Processors and other data requesters can access memory devices over a memory fabric. The memory fabric can include a network, communication links, and so forth, over which memory requests and data can be communicated between data requesters and memory devices.

Memory devices can be connected to respective media controllers, which are controllers to manage access of memory devices in response to requests from data requesters. In some systems, a fabric bridge can also be provided between data requesters and the memory fabric. The fabric bridge is an intermediate device that is able to perform various tasks, including routing memory requests to destination media controllers, as well as other tasks.

In some cases, media controllers support write posting. Write posting is supported by including a persistent posting buffer (or persistent posting cache) in a media controller. In response to receiving a write request, the media controller with a persistent posting buffer can store the write request (along with associated write data) in the persistent posting buffer. The media controller sends an acknowledgment of the write request back to a data requester or the fabric bridge once the write request is posted (written) to the persistent posting buffer. Thus, even though the write has not yet completed to the corresponding persistent memory device, the media controller can nevertheless send an acknowledgment of completion of the write request. The media controller will gradually complete the write to the persistent memory device at a later time.

In systems that support write posting or systems where media controllers have persistent caches to store write requests for completion at a later time, the performance of individual write operations may be asynchronous to operations of data requesters, including processors, programs (e.g., including machine-readable instructions such as software or firmware) executing on processors, or other data requesters. As a result, it may not be possible to synchronously signal errors for each write operation in a manner that allows the data requester to take corrective or containment action synchronously to the occurrence of the error. Taking corrective or containment action synchronously to the occurrence of the error refers to taking the respective action within a time interval of the error prior to the data requester having moved on to another write operation.

A corrective action can refer to an action to correct an error of a write operation, such as to re-submit the write request if the write operation did not succeed. A containment action can refer to an action to contain the error such that the error is not propagated to other entities of the system.

In accordance with some implementations of the present disclosure, a corrective or containment action in response to a write error can be performed at the time of performing a checkpointing procedure. A checkpoint refers to a point (in time or in a sequence of operations) that defines a boundary where pending writes are to be persisted prior to proceeding to subsequent memory access operations. Persisting a write refers to writing the data of the write to a persistent memory device. A checkpointing procedure refers to a procedure to set the checkpoint.

In some implementations, error tracking can be performed by using an error counter. A "counter" can refer to any storage element that stores a value that is updated in response to a given condition being satisfied. The error counter is updated in response to errors detected for a specified group of memory access operations. For example, updating the error counter can include advancing a value of the error counter, where advancing the error counter can include incrementing the error counter (in response to detecting each write error) or decrementing the error counter (in response to detecting each write error).

In response to detecting a change in value of the error counter, a data requester can take action to address the error at the time of performing a checkpointing procedure.

FIG. 1 is a block diagram of an example system that includes a processor 102 and a memory controller 104. The memory controller 104 can be separate from the processor 102, but connected to the processor 102 (directly or through another device). Alternatively, the memory controller 104 can be part of the processor 102. A processor can include a microprocessor, a core of a multi-core microprocessor, a microcontroller, a programmable integrated circuit, a programmable gate array, a system-on-a-chip (SoC), or another hardware processing circuit.

Although FIG. 1 shows just one processor 102 and the corresponding memory controller 104, in other examples, there can be multiple processors and respective memory controllers, or more generally, multiple data requesters and respective memory controllers. A data requester can refer to any device, such as a processor, an I/O device, and so forth, that is able to access data of a memory device.

In the ensuing discussion, reference is made to processors issuing memory requests. Note that this can refer to the respective memory controllers issuing the memory requests. In operation, the processor 102 issues an instruction to access memory to the memory controller 104, which responds by sending a memory request (write request, read request, etc.) targeted to a respective memory device.

Note also that a processor performing an action can also refer to a program (in the form of machine-readable instructions) executable on the processor to perform the action. Additionally, instead of a processor, another data requester can also issue an instruction to access memory.

The system further includes media controllers 106 that manage access of respective memory devices 108. A memory device 108 can refer to an individual integrated circuit (IC) memory chip, or to a memory module that has multiple memory IC chips. More generally, a memory device can refer to any arrangement of memory elements, whether implemented on one IC chip or multiple IC chips, or on one circuit board or multiple circuit boards. A memory device 108 can include persistent memory device or a non-persistent memory device.

In the ensuing discussion, it is assumed that the memory devices 108 are persistent memory devices. In other examples, some of the memory devices 108 can be non-persistent memory devices.

A media controller refers to a controller that is able to issue access commands to a memory device that meets a timing and protocol specification of the memory device. The protocol specification can define the access commands in the form of specific combinations of signals that are activated to cause corresponding memory access operations, including a read operation, a write operation, or any other operation that involves an access of a memory element (or a group of memory elements) of a memory device.

The timing specification governs timings of the signals, including, for example, minimum and/or maximum timing specifications of signals that are used to access the memory device.

Different types of memory devices can have different timing and protocol specifications.

The memory controller 104 is able to issue read and write requests that do not conform to timing and protocol specifications of specific memory devices. The read and write requests (as well as other access requests) issued by the memory controller 104 are more general requests. The memory access requests are issued by the memory controller 104 in response to respective requests of the processor 102. The memory access requests are routed by a fabric bridge 110 over a memory fabric 112 to a target media controller 106 (or multiple target media controllers 106). The memory fabric 110 can include a network, a link, or any other type of interconnect to allow for communication between the memory controller 104 and the media controllers 106.

A media controller 106 receiving a memory request from a memory controller 104 can generate the corresponding access commands to access the respective memory device 108. For a write request, data provided by the memory controller 104 is written by the media controller 106 to the respective memory device 108. For a read request, the media controller 106 retrieves read data from the respective memory device 108, and sends the read data over the memory fabric 110 to the memory controller 104.

The fabric bridge 110 can refer to any intermediate device (or collection of devices) that is able to receive a memory request from the memory controller 104 and to provide the memory request to a target media controller 106 (or media controllers 106).

In the example of FIG. 1, the fabric bridge 110 includes a mapper 114 and a switch 116. The mapper 114 includes an address mapping logic 118, an error containment logic 120, and an error tracking logic 122. The address mapping logic 118 can map between an address used by the memory controller 104 and an address used on the memory fabric 112. In examples where the address space of the memory controller 104 is the same as the address space of the memory fabric 112, then address mapping does not have to be performed by the fabric bridge 110.

The error containment logic 120 ensures that an error that occurred in a memory access operation, including in a write operation, is isolated such that any subsequent access of a memory region associated with the error is blocked. In this way, the error is not propagated to another entity of the system. In performing error containment, any read to a region associated with an error results in a response that includes an error status sent back to the data requester, so that the data requester can perform an abort. Any writes to the region associated with the error can be dropped, with a corresponding error indication sent back to the data requester.

The error tracking logic 122 is able to track errors associated with respective groups of memory operations, i.e., on a per-group basis. A group of memory operations can refer to any collection of memory operations that are related to one another in some way. For example, a group of operations can refer to memory operations that are associated with a group of memory devices, a group of portions of memory devices, or any other defined group. By tracking errors for groups of memory operations rather than individual memory operations, the number of errors that have to be handled can be reduced.

In further examples, a group of memory access operations can include a group of memory access operations to a specified memory address space segment (including one or multiple memory devices or memory device portions), a group of memory access operations to a specified number of memory links, and a group of memory access operations to a specified collection of media controller identifiers.

The switch 116 in the fabric bridge 110 is used to route requests and data over appropriate paths of the memory fabric 112 to respective media controllers. The switch 116 can also forward data and other information back to the processor that submitted a memory request.

The error tracking logic 122 includes an error counter 124 that tracks errors associated with a group of memory access operations. The error tracking logic 122 detects an error associated with a given group of memory access operations, determines whether the detected error causes an error state change of the given group of memory access operations, and causes an update of the error counter 124 in response to determining that the detected error causes the error state change of the given group of memory access operations.

Note that the error counter 124 can track errors for multiple groups of memory access operations. By using one error counter 124 to track multiple groups of memory access operations, enhanced efficiency can be achieved since a large number of error counters would not have to be used if there are a large number of groups of memory access operations. For example, if an error occurred in a first group of memory access operations that causes an error state change in the first group of memory access operations, the error counter 124 is updated. If at a later time an error occurred in a second group of memory access operations that causes an error state change in the second group of memory access operations, then the error counter 124 is updated again. By using a common error counter for multiple groups of memory access operations, efficiency is enhanced since a data requester can read just one error counter to determine if an error state change has occurred that causes the data requester to determine the appropriate error handling to perform.

In other examples, there can be multiple error counters to track errors for respective different segments of a system. For example, the fabric bridge 110 can include multiple mappers that include respective error counters 124.

FIG. 1 also depicts a register 126 that is part of the mapper 114. The processor 102 can issue a register read request to the register 126 as part of a checkpoint procedure. A checkpoint procedure refers to a procedure to define a specific point (such as a point in time or a point in the execution of a program) where it is confirmed that all prior writes have completed (i.e., have been persisted to persistent memory). A response to the register read request provides an indication to the processor 102 that all pending writes issued by the fabric bridge 110 to a media controller 106 (or multiple media controllers 106) have been persisted by the media controller 106 (or multiple media controllers 106).

Figure 2:
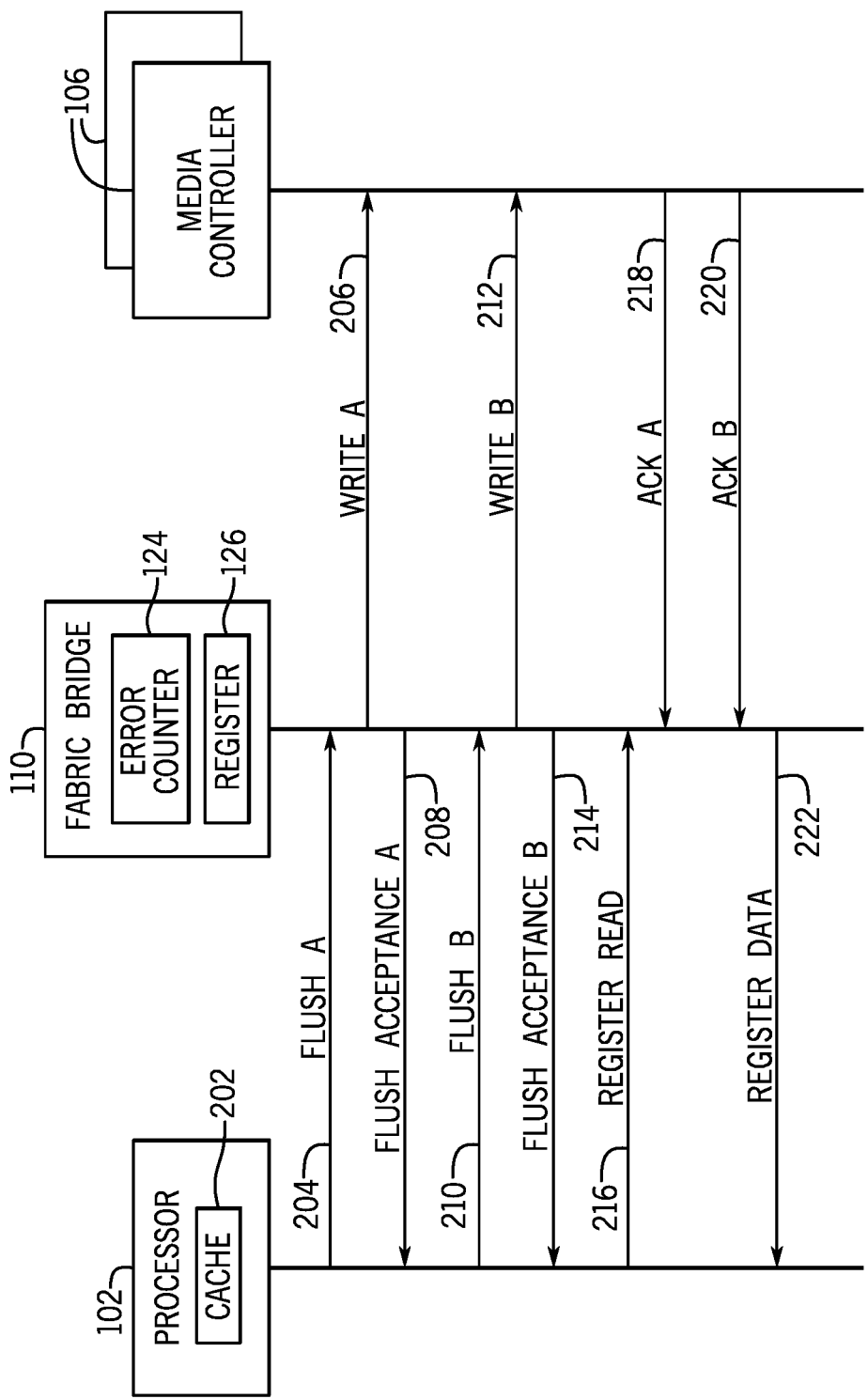
FIG. 2 is a flow diagram of a commit checkpointing with error tracking process according to some examples.

FIG. 2 shows an example commit checkpointing with error tracking procedure. A commit operation refers to an operation initiated by the processor 102 (or another data requester) to ensure that all data modified by the processor 102 is written to persistent memory. A commit checkpointing operation refers to an operation where the writes associated with the commit operation are confirmed to be persisted. Error tracking when performed in conjunction with commit checkpointing refers to tracking any errors that are performed during the commit checkpointing operation.

As shown in FIG. 2, the processor 102 includes a non-persistent cache memory 202. The cache memory 202 is a high-speed memory to store a subset of data of the memory devices 108, which can have lower access speeds than the cache memory 202. Faster reads and writes can be performed to the cache memory 202. As the processor 102 performs writes to the cache memory 202, some of the data in the cache memory 202 can become modified (also referred to as "dirty") with respect to a corresponding data that is stored in persistent memory (including a memory device 108 or multiple devices 108).

Since the cache memory 202 is non-persistent, the processor 102 can initiate flushes of modified data in the cache memory 202 back to the persistent memory, to persist the modified data in the cache memory 202. Writing modified data of the cache memory 202 back to persistent memory can be performed as part of a writeback operation, which is initiated by the processor 102 whenever the processor 102 wishes to persistent modified data in the cache memory 202. In other examples, modified data can be flushed from the cache memory 202 to provide additional space in the cache memory 202 to store additional data. This latter process is part of an eviction process, where data in the cache memory 202 is evicted to make space for other data.

The following is an example sequence of code that can be executed by the processor 102 as part of a commit checkpointing procedure.

Write A;
Write B;
Flush A;
Flush B;
Barrier;
Register read.

In the foregoing sequence, write A is an instruction to write data A to memory, and write B is an instruction to write data B to memory. It is assumed that the write A and write B instructions cause data A and B to be written to the cache memory 202, without a corresponding write to persistent memory. Once write A and write B are executed, data A and B in the cache memory 202 are modified with respect to corresponding data in the persistent memory.

Flush A and flush B are instructions to flush modified data A and B, respectively, from the cache memory 202 to the persistent memory. Flush A and flush B can be executed as part of a writeback operation or a cache eviction operation.

The barrier instruction is issued by the processor 102 to cause the processor 102 to verify that writes issued before the barrier instruction are complete (are persisted to persistent memory) before the processor 102 executes subsequent instructions. If the processor 102 executes the barrier instruction, the processor 102 waits for an acknowledgement of each of the writes issued by the processor 102 before the barrier instruction. Each such acknowledgement indicates that the corresponding write has been persisted to persistent memory by a respective media controller.

The register read instruction (also referred to as a "register read request" in the ensuing discussion) to read the register 126 of the fabric bridge 110 is used to allow the fabric bridge 110 to confirm to the processor 102 when all writes issued by the processor 102 have been persisted.

As shown in FIG. 2, to perform eviction or writeback of the cache memory 202, the processor 102 sends (at 204) a flush A instruction. In the example of FIG. 2, the memory controller 104 is omitted. If the memory controller 104 is present, then the flush A instruction is sent to the memory controller 104, which in turn generates the corresponding write request that is sent to the fabric bridge 110 to persist modified data A, and also generates an acceptance of the flush instruction. In the example of FIG. 2, it is assumed that the operations of the memory controller 104 are part of the fabric bridge 110.

The fabric bridge 110 responds to the flush A instruction by sending (at 206) the write A request to a target media controller 106 to write modified data A to the persistent memory. The fabric bridge 110 also responds to the flush A instruction by sending (at 208) flush acceptance A to the processor 102. Flush acceptance A can refer to any acceptance or acknowledgment that is sent to indicate that the flush A instruction has been received by the fabric bridge 110. Flush acceptance A can be in the form of a message, an information element in the message, or another indication. Note that flush acceptance A is sent by the fabric bridge 110 before the write to the persistent memory has completed.

As further shown in FIG. 2, the processor 102 sends (at 210) a flush B instruction to cause a flush of modified data B. In response to the flush B instruction, the fabric bridge 110 sends (at 212) a write B request to a target media controller 106, and also sends (at 214) flush acceptance B to the processor 102.

The processor 102 further issues a register read request (at 216) to the register 126 in the fabric bridge 110, for confirming that the commit operation associated with the flush request (204, 210) has completed. The register read request creates an epoch (a point in time) to allow for a confirmation that all writes prior to the epoch have been persisted. In the example of FIG. 2, the writes include the write A request and the write B request. The commit operation includes the flushing of modified data A and B using the flush A and flush B instructions. The commit operation is completed when the modified data A and B is persisted to the persistent memory device.

Note that the fabric bridge 110 does not respond to the register read request (216) until persistence of the modified data A and B has been confirmed.

The media controller(s) 106 respond(s) to the write request A and the write request B by sending respective write acknowledgement messages A and B (at 218, 220). Receipt of the write acknowledgement messages A and B provide an indication to the fabric bridge 110 that modified data A and B have been persisted. In response to the register read request (216) and the confirmation of persistence of the modified data A and B (based on the write acknowledgment messages A and B), the fabric bridge 110 sends (at 222) data of the register 126 to the processor 102. Receipt of the register data (at 222) by the processor 102 provides an indication to the processor 102 that persistence of data A and B has been confirmed. At this point, the checkpointing operation is complete, and the processor 102 can proceed to execute further instructions.

In some examples, in addition to the error counter value, the fabric bridge 110 can also send, to the processor 102, information representing an error state associated with the group of memory access operations. The information representing the error state can specify which error state level (e.g., first error state level, second error state level, and third error state level) has been encountered.

In accordance with some implementations of the present disclosure, to allow for error tracking as part of the commit checkpointing operation depicted in FIG. 2, the register data that is returned to the processor 102 by the fabric bridge 110 includes a value of the error counter 124. The processor 102 can maintain a previous value of the error counter 124. If the error counter value returned in the register data 222 is different from the previous value of the error counter 124 (based on a comparison of the received counter value and the previous counter value), then the processor 102 makes a determination that an error state change has occurred. In response to the error state change, the processor 102 performs error handling. Note that a processor performing an action can refer to a program (which executes on the processor) performing the action.

For a given group of memory access operations, several different error states can be associated with the given group of memory access operations. Examples of error states can include the following: normal state (non-error state where no error has been encountered in the group of memory access operations), a first level error state, a second level error state, and a third level error state. The second level error state represents an error condition that is more severe than the first level error state, and the third level error state represents an error condition that is more severe than the second level error state. Although a specific number of error states is referred to in the present discussion, it is noted that in other examples, a different number of error states can be employed.

The first level error state can represent a type of error that allows for a degraded mode of operation of a system in response to the error. The degraded mode of operation can be performed with error containment. In some examples, this type of error can include an error of a memory device, such as due to the memory device failing. In examples where a data redundancy scheme is employed, failure of a memory device (or multiple memory devices) may not be catastrophic. For example, the data redundancy scheme can employ data mirroring, where the same copy of data is stored in both a primary memory device and a backup memory device. Should the primary memory device fail or exhibit a fault, the data can be retrieved from the backup memory device. In such an example, a degraded mode of operation refers to an operation where memory accesses are satisfied from the backup memory device while the primary memory device remains unavailable. In other examples, a Redundant Array of Independent Disks (RAID) scheme can be employed to provide error protection. Some RAID schemes can store error protection data, also referred to as parity data, along with actual data in a set of memory devices. When a memory device of the set of memory devices fails or exhibits a fault, the data contained in the remaining memory devices of the set can be used to recreate the original data, such that the system can continue to operate in a degraded mode of operation.

In other examples, other types of error protection schemes can be employed. Generally, a degraded mode of operation refers to a mode of operation where data writes and reads to memory continue to be successful, except that certain components, such as memory devices, have failed or have exhibited another fault.

The second level error state is an error state where containment has to be provided for an error of a group of memory access operations. For example, this type of error may be due to a fault of a communication link. When a communication link is down, a memory device (or multiple memory devices) may be inaccessible by a data requester. As a result, a degraded mode of operation may or may not be possible. The degraded mode of operation is possible if all data requesters (e.g., processors, programs, etc.) accessing a memory device that is affected by the faulty communication link has the same view of the fault; in other words, all data requesters can either access the memory device behind the faulty communication link, or all data requesters are unable to access the memory device behind the faulty communication link. If some data requesters are able to access memory behind the faulty communication link while other data requesters are not able to access the memory behind the faulty communication link, then the data requesters would have different views of the faulty communication link, and as a result, the degraded mode of operation is not allowed. However, if all data requesters have the same view of the faulty communication link, then the degraded mode of operation can be allowed.

The third level error state refers to an error where error containment has to be performed, and degraded mode of operation is not allowed. An example of this type of error is a poisoned flush operation, where modified data in the cache memory of a processor that is to be flushed to a persistent memory device is corrupted. This type of error is not allowed to proceed, as the poisoned flush would cause corrupted data to be written to persistent memory. The third level error state can be detected by a hardware processing circuit of the fabric bridge 110, based on the specific error detected (e.g., the modified data in the processor cache is corrupted). With the second level error state, whether or not a degraded mode of operation is allowed involves the data requester making a determination based on the data requester's knowledge of a system.

In accordance with some implementations of the present disclosure, for a given group of memory access operations, the error counter 124 is updated in value (e.g., advanced by incrementing or decrementing) in response to a change in error state, such as from the normal state to any of the first, second, and third level error states, or from a transition between any of the first, second, and third level error states.

The error tracking logic 122 determines whether a detected error corresponds to a same error state as a current error state of a group of memory access operations. The error tracking logic 122 indicates that the detected error causes the error state change (by updating the error counter 124) in response to determining that the detected error does not correspond to the same error state as the current error state of the group of memory access operations. The error tracking logic 122 leaves the error counter 124 unchanged in response to determining that the detected error corresponds to the same error state as the current error state of the group of memory access operations.

Figure 3:
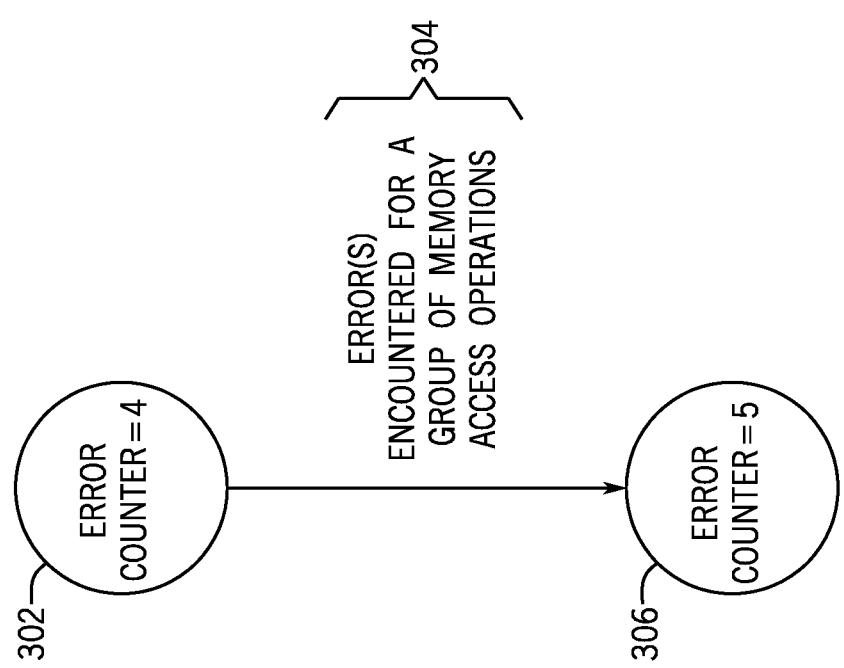

In the example of FIG. 3, the error counter 124 can have an initial value of 4 (as indicated by 302). Note that it does not matter what the actual value of the error counter 124 is, only that an error counter changes value. During execution of a group of memory access operations, an error (or multiple errors) 304 may be encountered. If the encountered error(s) cause(s) a transition in error state within a given group of memory access operations, then the error counter 124 is incremented (at 306) to the value 5. Note that any error that is encountered that does not cause a change in error state would not result in incrementing of the error counter 124. For example, the error counter 124 may have been incremented to the value 4 in response to a memory device failure or other fault, which caused a transition from the normal state to the first level error state. A further memory device failure may cause the error state to remain at the first level error state within the given group of memory access operations, in which case the error counter 124 would not increment since there is no error state change due to the further memory device failure. However, if another error occurs that causes a transition to the second level error state (such as due to a communication link failing) in the given group of memory access operations, then the error counter is incremented to the value 5.

The ability to not increment the error counter 124 unless an error state change occurs within a group of memory access operations allows for the error counter 124 to report that a change in error type has occurred, rather than report multiple errors individually. In other words, multiple errors of the same error type would not result in an error state change, so that the error counter 124 would not update multiple times in response to the multiple errors of the same error type.

In this manner, the processor 102 would not have to separately handle each error of the same error type individually. Rather, the processor 102 can determine whether the error counter value has changed, and if so, can take appropriate action to identify the errors that have occurred (based on reading error logs, for example) and to take appropriate action in response to the errors. The error handling performed by the processor 102 can include performing a degraded mode of operation, in which case the processor 102 allows memory access operations to continue. Alternatively, the error handling performed by the processor 102 can include error containment without allowing a degraded mode of operation.

Figure 4:
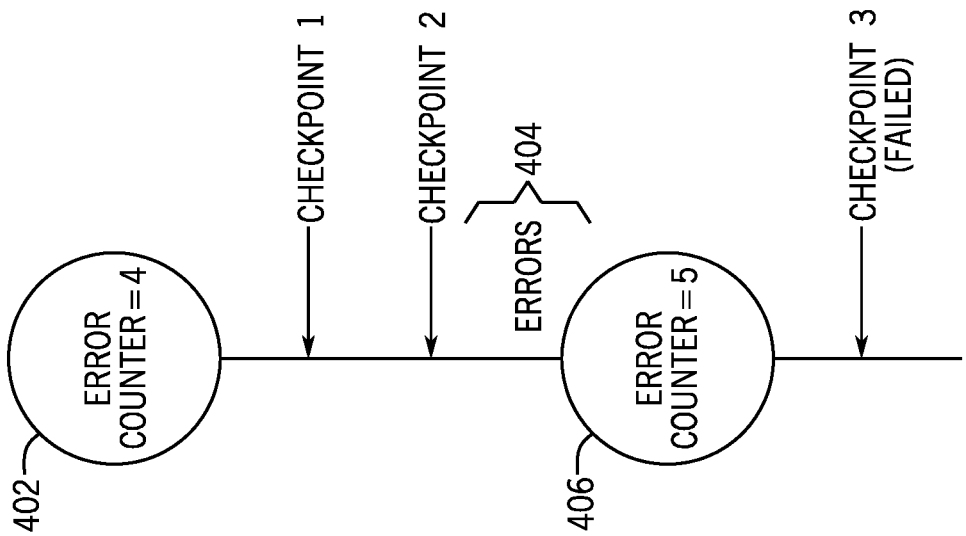
FIGS. 3 and 4 illustrate errors causing an update of an error counter, according to some examples.

FIG. 4 depicts a further example that shows the error counter 124 initially at the value 4 (at 402). FIG. 4 also shows checkpoints 1 and 2 successfully created as a result of corresponding checkpoint operations. A checkpoint is successfully created if no write errors occurred during the respective checkpoint operation.

After checkpoint 2, errors 404 cause the error counter 124 to increment to the value 5 (at 406). Such errors can cause the checkpoint operation corresponding to checkpoint 3 to fail, in which case checkpoint 3 is not successfully set.

Figure 5:
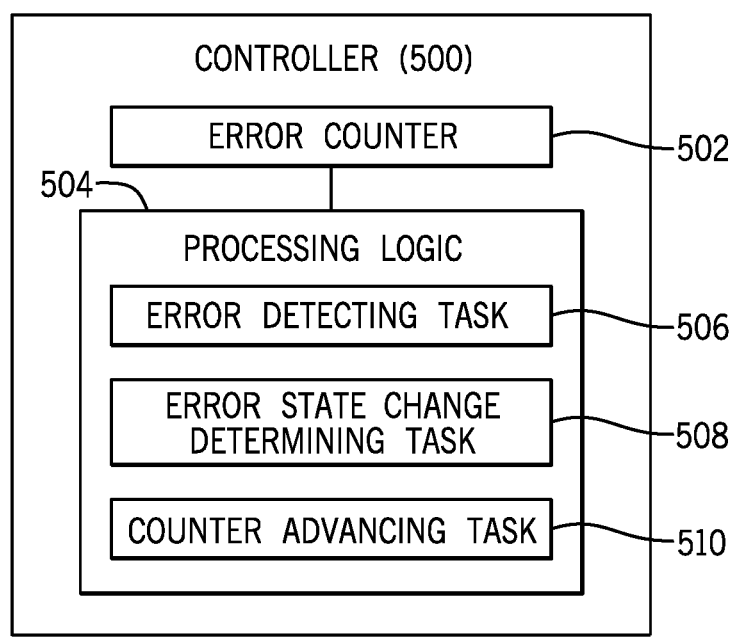
FIG. 5 is a block diagram of a controller according to further examples.

FIG. 5 is a block diagram of a controller 500 according to further examples. The controller 500 can be part of the fabric bridge 110, the memory controller 104, or another device of a system.

The controller 500 includes an error counter 502 to track errors associated with a group of memory access operations. The controller 500 further includes a processing logic 504 to perform various tasks. The processing logic 504 can be implemented as a hardware processing circuit, or as a combination of a hardware processing circuit and machine-readable instructions executable on the hardware processing circuit.

The hardware processing circuit can include a microprocessor, a core of a multi-core microprocessor, a microcontroller, a programmable gate array, a programmable integrated circuit device, or any other hardware processing circuit.

The tasks performed by the processing logic 504 include an error detecting task 506 to detect an error associated with the group of memory access operations. The tasks also include an error state change determining task 508 to determine whether the detected error causes an error state change of the group of memory access operations. The tasks further include a counter advancing task 510 to cause advancing of the error counter 502 responsive to determining that the detected error causes the error state change of the group of memory access operations.

Figure 6:
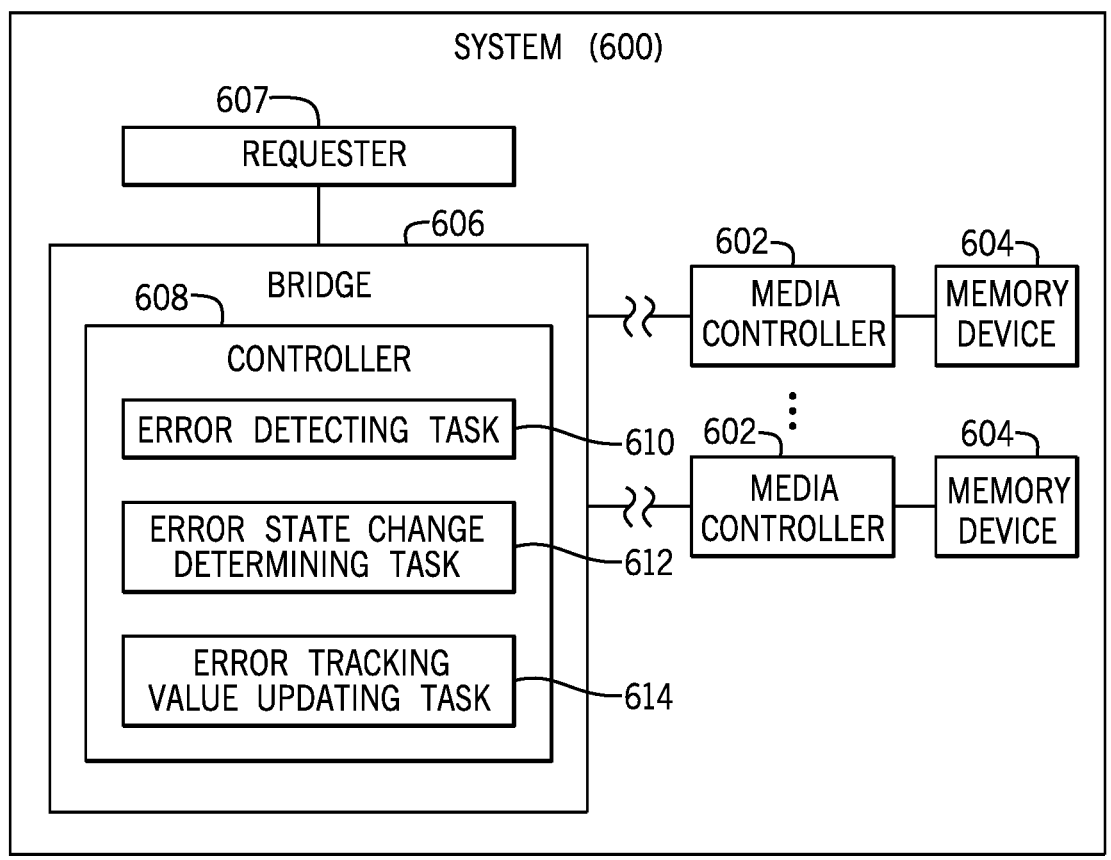
FIG. 6 is a block diagram of a system according to additional examples.

FIG. 6 is a block diagram of a system 600 according to alternative implementations. The system 600 includes media controllers 602 to control access to memory devices 604. The system 600 further includes a bridge 606 to route memory requests from a requester 607 to the media controllers. The bridge 606 includes a controller 608 to various tasks. The tasks include an error detecting task 610 to detect an error associated with a group of memory access operations of the requester.

The tasks further include an error state change determining task 612 to determine whether the detected error causes an error state change of the group of memory access operations. The tasks further include an error tracking value updating task 614 to update an error tracking value (e.g., a counter value) responsive to determining that the detected error causes the error state change of the group of memory access operations.

The controller 608 does not update the error tracking value responsive to determining that the detected error does not cause the error state change of the group of memory access operations.

Figure 7:
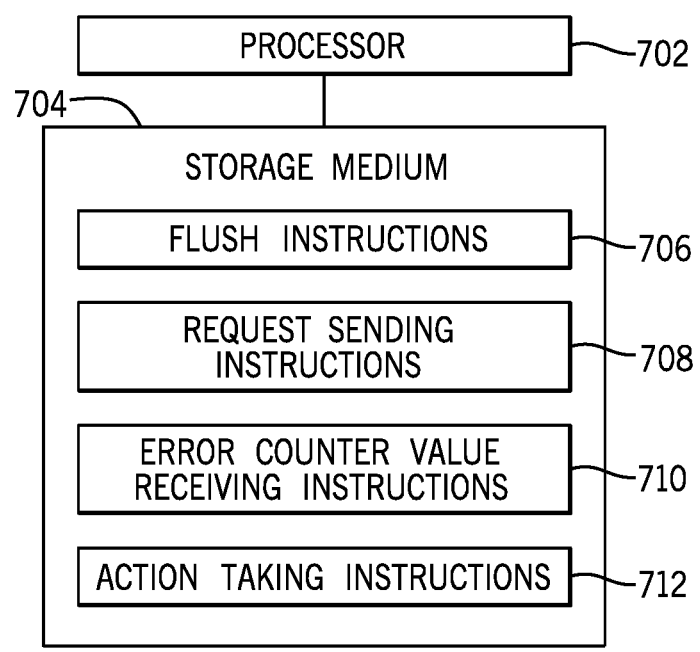
FIG. 7 is a block diagram of an arrangement including a processor and a machine-readable storage medium storing instructions according to some examples.

FIG. 7 is a block diagram of an arrangement including a processor 702 and a non-transitory machine-readable or computer-readable storage medium 704 storing machine-readable instructions executable on the processor 702 to perform various tasks. The machine-readable instructions include flush instructions 706 to flush cache data from a cache memory to a network to which media controllers are coupled, the flushing of the cache data comprising write operations that are part of a group of memory access operations.

The machine-readable instructions further include request sending instructions 708 to send, to a bridge in the network, a request seeking a response once the write operations have successfully completed and are persisted. The machine-readable instructions further include error counter value receiving instructions 710 to receive, in response to the request, an error counter value that is updated in response to an error associated with the group of memory access operations causing an error state change of the group of memory access operations. The machine-readable instructions further include action taking instructions 712 to, in response to determining that the received error counter value is different from a current error counter value, take action to address the error.

The action taken can include a degraded mode of operation or an error containment action.

The storage medium 704 can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A controller comprising:
   a counter to track errors associated with a group of memory access operations; and
   processing logic to:
      detect an error associated with the group of memory access operations,
      determine whether the detected error causes an error state of the group of memory access operations to change by comparing an error type of the detected error to a previously detected error type of the group of memory access operations, wherein the detected error causes the error state of the group of memory operations to change if the error type of the detected error is different from the previously detected error type, and wherein the error type comprises one or more of: a device fault, a communication link fault, and a poisoned flush from a cache memory;
      cause advancing of the counter responsive to determining that the detected error causes the error state change of the group of memory access operations; and
      leave the counter unchanged in response to determining that the detected error corresponds to the same error state as the current error state of the group of memory access operations.

2. The controller of claim 1, wherein the error state change comprises a transition from a first error state to a second error state that is different from the first error state.

3. The controller of claim 2, wherein the second error state represents an error condition that is more severe than the first error state.

4. The controller of claim 2, wherein the first error state is a non-error state indicating that no error has been encountered in the group of memory access operations.

5. The controller of claim 2, wherein the second error state indicates one of a device fault, a communication link fault, and a poisoned flush from a cache memory.

6. The controller of claim 1, wherein the processing logic is to:
   receive a register read request from a requester, the register read request being part of a checkpointing operation, and
   return a count value of the counter in response to the register read request.

7. The controller of claim 6, wherein the response to the register read request indicates that write data of write operations in the group of memory access operations has been persisted.

8. The controller of claim 7, wherein the write operations are responsive to cache flush operations from a cache memory of the requester.

9. The controller of claim 6, wherein the processing logic is to:
   send, to the requester, information representing an error state associated with the group of memory access operations.

10. The controller of claim 6, wherein the processing logic is to:
   take at least one of corrective and containment action synchronously at the time of the checkpointing operation.

11. The controller of claim 1, wherein the group of memory access operations comprises one of:
   a group of memory access operations to a specified memory address space segment;
   a group of memory access operations to a specified number of memory links, and
   a group of memory access operations to a specified collection of media controller identifiers.

12. A system comprising:
   media controllers to control access to memory devices;
   a bridge to route memory requests from a requester to the media controllers, the bridge comprising a controller to:
      detect an error associated with a group of memory access operations of the requester,
      determine whether the detected error causes an error state of the group of memory access operations to change by comparing an error type of the detected error to a previously detected error type of the group of memory access operations, wherein the detected error causes the error state of the group of memory operations to change if the error type of the detected error is different from the previously detected error type, and wherein the error type comprises one or more of: a device fault, a communication link fault, and a poisoned flush from a cache memory; and update an error tracking value responsive to determining that the detected error causes the error state change of the group of memory access operations and leave the error tracking value unchanged responsive to determining that the detected error does not cause the error state change of the group of memory access operations.

13. The system of claim 12, wherein the detected error causes the error state change if the detected error causing a more severe error than a current error state of the group of memory access operations.

14. The system of claim 12, wherein the bridge comprises a register, and the controller is to:

receive a request to read the register as part of a checkpointing operation; and return the updated error tracking value in response to the request.

15. The system of claim 14, wherein the checkpointing operation is to ensure that all write operations of the group of memory access operations has completed before proceeding to a subsequent memory access operation after the group of memory access operations.

16. The system of claim 14, the system to:

take at least one of corrective and containment action synchronously at the time of the checkpointing operation.

17. An apparatus comprising:

a processor; and a non-transitory storage medium storing instructions executable on the processor to:

flush cache data from a cache memory to a network to which media controllers are coupled, the flushing of the cache data comprising write operations that are part of a group of memory access operations;

send, to a bridge in the network, a request seeking a response once the write operations have successfully completed and are persisted;

receive, in response to the request, an error counter value that is updated in response to a newly detected error associated with the group of memory access operations causing an error state change of the group of memory access operations and leave the error counter value unchanged when the newly detected error does not cause the error state change of the group of memory access operations, wherein the newly detected error causes the error state of the group of memory operations to change if an error type of the newly detected error is different from a previously detected error type of the group of memory operations, and wherein the error type comprises one or more of: a device fault, a communication link fault, and a poisoned flush from a cache memory;

in response to determining that the received error counter value is different from a current error counter value, take action to address the error.

18. The apparatus of claim 17, wherein the action comprises a degraded mode of operation.

19. The apparatus of claim 17, wherein the action comprises error containment.

20. The apparatus of claim 17, the instructions executable on the processor to:

take at least one of corrective and containment action synchronously at the time of the checkpointing operation.

* * * * *